United States Patent [19]

Zulaski

[11] 4,002,976
[45] Jan. 11, 1977

[54] VOLTAGE SENSING DEVICE FOR USE AT HIGH VOLTAGE

[75] Inventor: John A. Zulaski, Mount Prospect, Ill.
[73] Assignee: S&C Electric Company, Chicago, Ill.
[22] Filed: Apr. 1, 1975
[21] Appl. No.: 564,109
[52] U.S. Cl. .............................. 324/126; 323/76; 336/70; 336/90; 324/127
[51] Int. Cl.² ...................... G01R 1/20; G05F 5/00
[58] Field of Search ............ 324/126, 127; 336/70, 336/90; 323/74, 76, 93; 174/137, 11 BH

[56] References Cited
UNITED STATES PATENTS

| | | | |
|---|---|---|---|
| 2,668,274 | 2/1954 | Schneider | 323/61 |
| 3,386,059 | 5/1968 | Stein, Jr. et al. | 336/84 |
| 3,599,134 | 8/1971 | Galloway | 336/90 |
| 3,612,988 | 10/1971 | Wanlass | 323/43.5 R |
| 3,882,373 | 5/1975 | Brenig | 323/66 |
| 3,943,435 | 3/1976 | Dejarnette | 323/76 |
| 3,947,725 | 3/1976 | Lucas | 317/12 B |

*Primary Examiner*—Palmer C. Demeo
*Assistant Examiner*—Vincent J. Sunderdick
*Attorney, Agent, or Firm*—Kirkland & Ellis

[57] ABSTRACT

A compact voltage sensing device for connection to an alternating current high voltage circuit is imbedded within an organic polymeric insulator body that is formed to provide both mechanism support and "line to ground" insulation for a conductor or component connected thereto. The voltage sensing device comprises a capacitor and step-down transformer in series from the conductor to ground which provides a low voltage output which may be used to determine the magnitude of the voltage on the conductor, or as a source of control voltage for auxiliary apparatus. The insulator body may be made to be equal in height and have the same mounting configuration as a conventional insulator so that it can be substituted for a conventional insulator in a distribution system. The performance of the insulator body as insulation is not compromised by the presence of internal electrical components.

22 Claims, 8 Drawing Figures

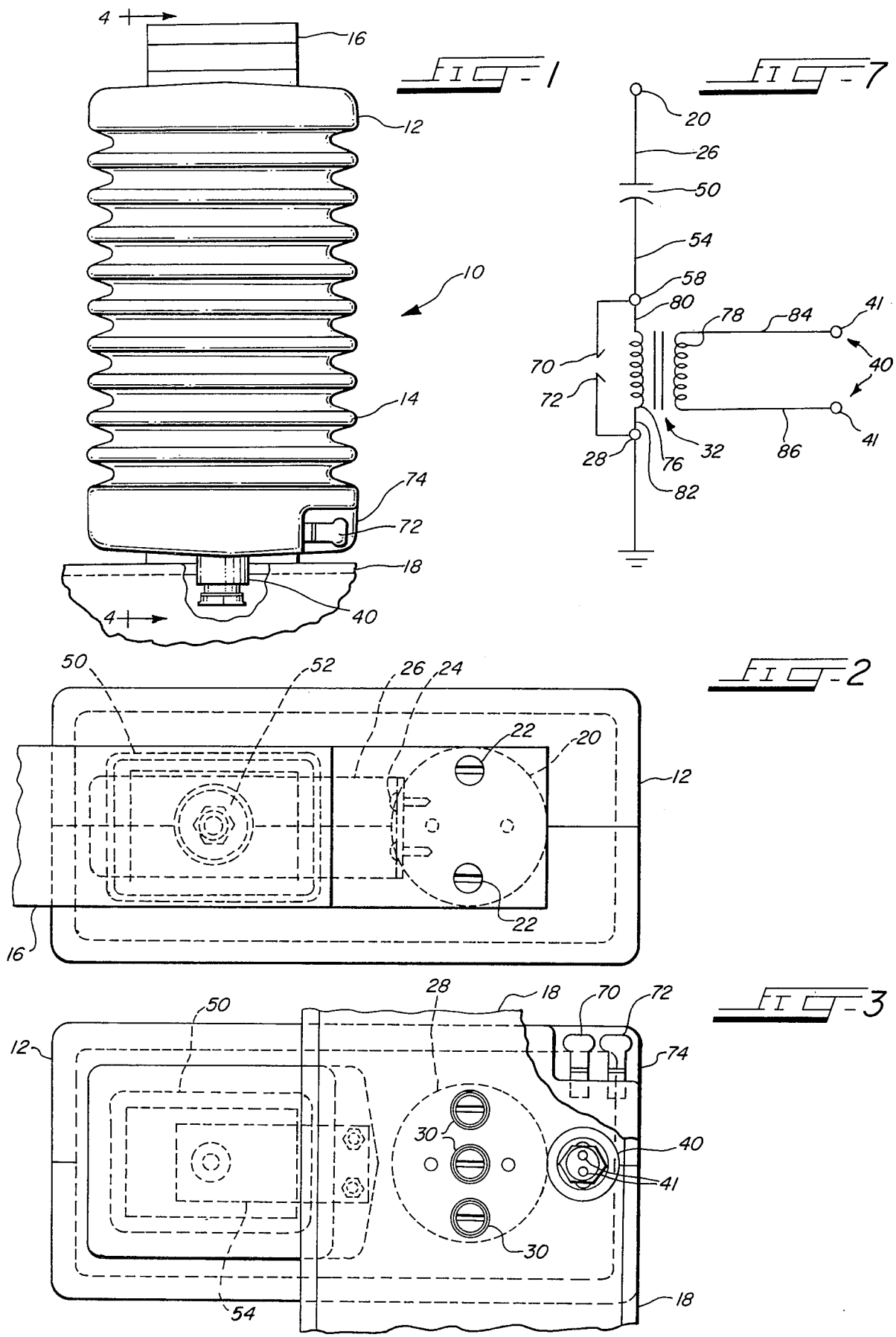

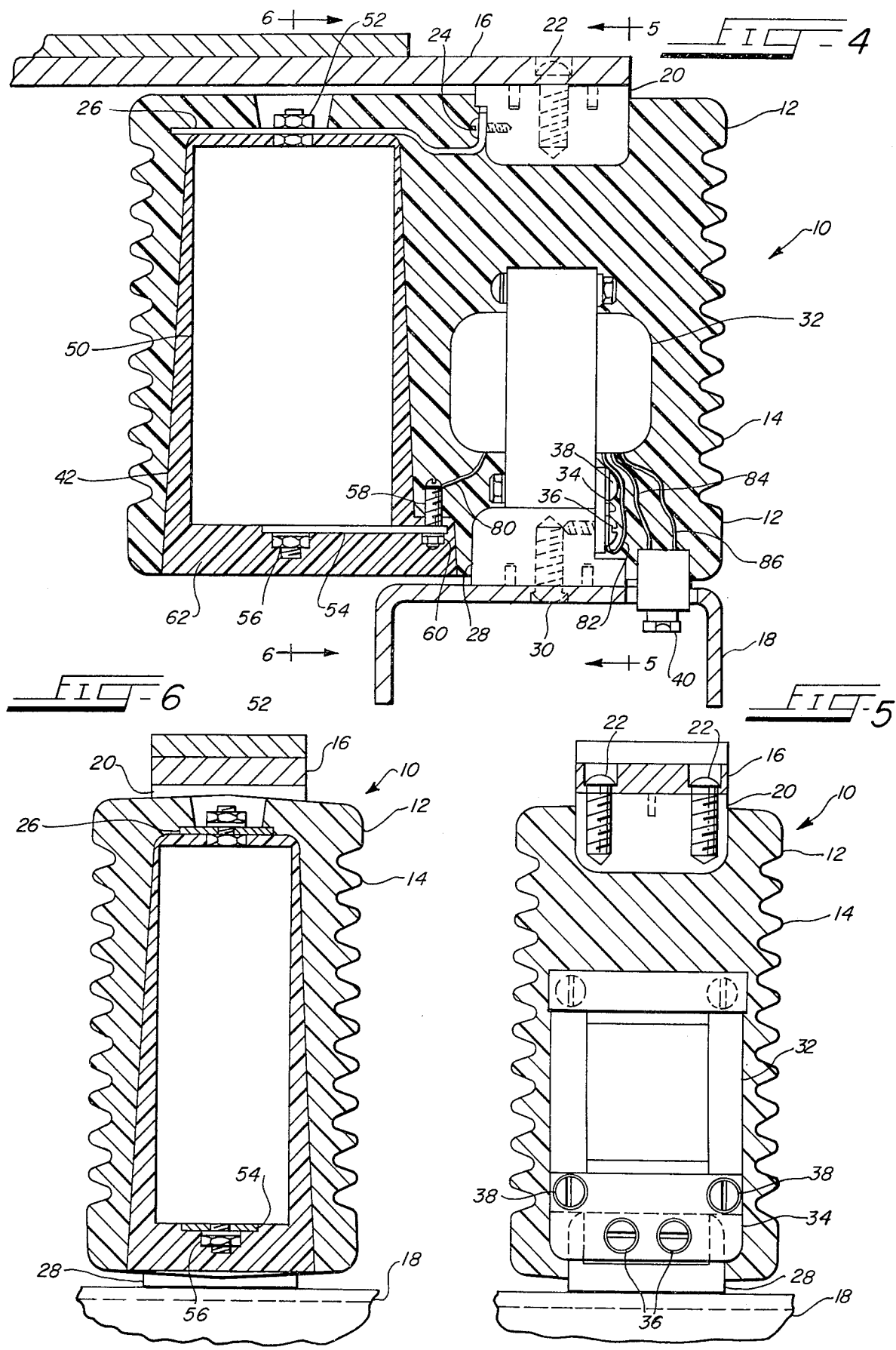

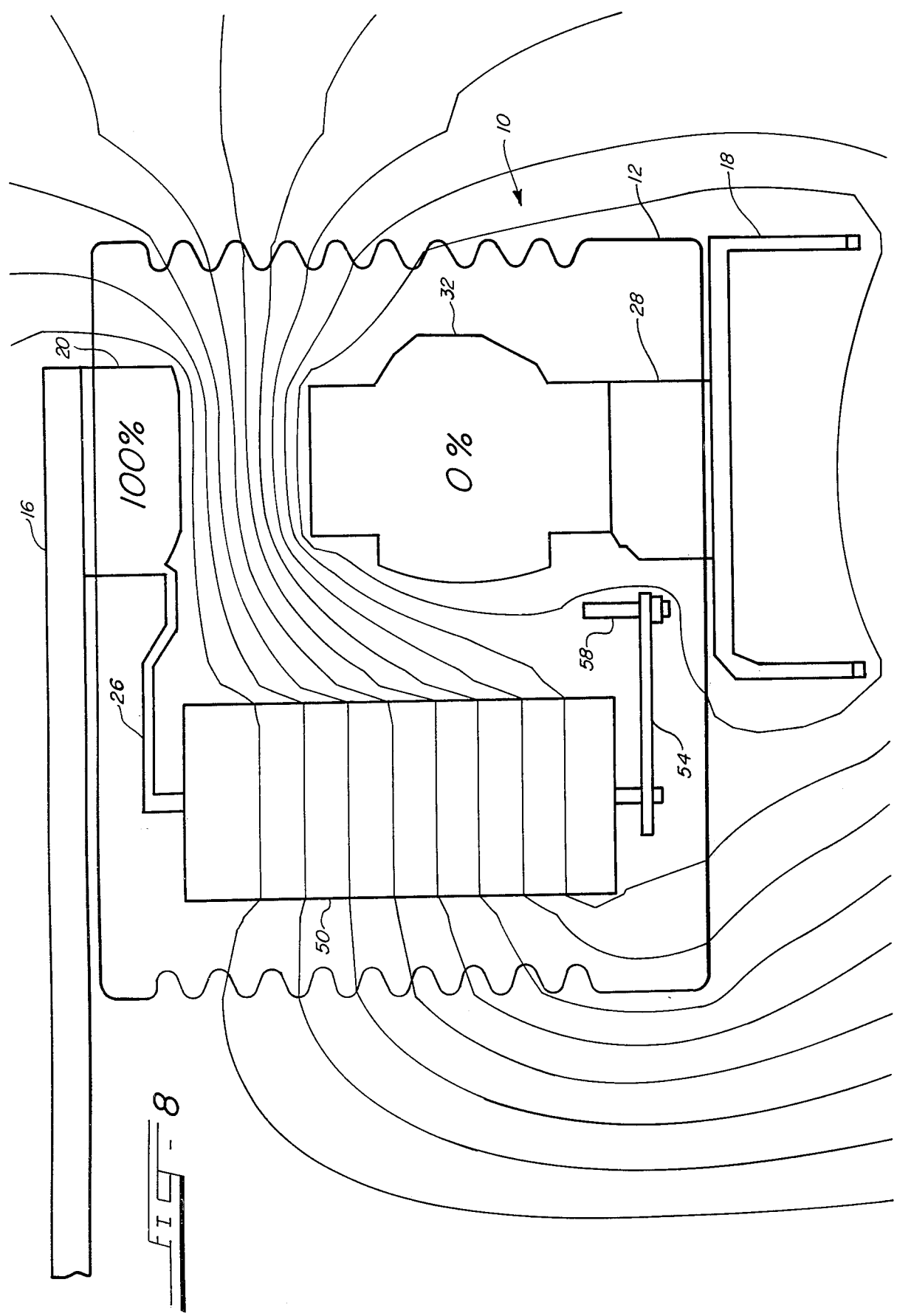

VOLTAGE SENSING DEVICE FOR USE AT HIGH VOLTAGE

BACKGROUND OF THE INVENTION

1. Field of the Invention

The present invention relates to voltage sensing devices for use at high voltage and more particularly to methods of fabricating and structure of high voltage sensing devices for measuring voltage encapsulated within an insulated body.

2. Description of the Prior Art

Various types of devices to sense high voltage are well known in the art. For example, a conventional potential transformer may be used to obtain a low voltage representation of the high voltage magnitude on a conductor or to provide electrical power for a low-burden auxiliary apparatus. In addition, resistance voltage dividers also provide similar functions and are generally less expensive than potential transformers. Further, capacitance voltage dividers are also known to the art, and these devices may also be utilized to perform the function of obtaining a low voltage representation of the magnitude of high voltage on a conductor and to power low-burden auxiliary apparatus.

Proximity type voltage sensing devices are also well known and have been incorporated into the internal structure of insulator bodies. For example, U.S. Pat. No. 3,187,282 — Pierce et al. and U.S. Pat. No. 3,251,014 — Stein, Jr. illustrates proximity type voltage sensing devices that are incorporated into an electrical insulator body. However, one disadvantage of the proximity sensing device as disclosed in the Pierce, et al. and Stein, Jr. patents is that such proximity sensing devices cannot be utilized to provide a source of power for low-burden apparatus.

Thus, it would be a desirable advance in the art to provide a compact voltage sensing device incorporated within an insulator body such that both mechanical support and "line to ground" insulation is provided so that the voltage sensing device can be utilized to either determine the voltage on a conductor or to power low-burden auxiliary apparatus.

BRIEF DESCRIPTION OF THE INVENTION

A sensing device for sensing voltage between a high voltage side of a circuit and ground comprises a capacitor electrically connected at a first side to the high voltage side of the circuit and a step-down transformer having primary and secondary windings, the primary winding being serially connected between the second side of the capacitor and ground. Output terminals are connected to the secondary winding to provide a point at which voltage signals representative of the voltage on the high voltage side of the circuit can be measured. An insulator body means is molded of an electrically insulating material such as cast epoxy resin to surround the capacitor and the transformer. The insulator body means provides mechanical support for the capacitor and the transformer, and also provides line to ground insulation between the high voltage side of the circuit and ground.

Spark gap electrodes are electrically connected in parallel across the primary winding of the transformer and extend from the surface of the insulator body means in close proximity to one another so that if excessive voltage is experienced across the primary winding, an arc may form across the electrodes to limit the voltage across the primary windings.

The insulator body means may be dimensioned and adapted to have the same mounting configuration and physical length as a conventional porcelain or resin insulator so that the present invention may be substituted for a conventional insulator in a circuit so that two distinctive functions are provided at one location.

Utilization of the series connected step-down transformer provides output current that is capable of powering a larger burden than may be placed on the output of a conventional capacitance voltage divider of a similar physical size. In the conventional divider, no more than a portion of the current which passes through the divider may be used to power the burden.

Moreover, the present invention involves a unique method of fabricating a high voltage sensing device wherein all of the electrical components except the capacitor are molded into the insulator body, and a hollow capacitor receiving cavity is formed in the body of the insulator. The capacitor is then inserted into the hollow capacitor receiving cavity, and a room temperature curing polymeric compound is poured into the cavity completely sealing the capacitor into the insulator body. This method is particularly advantageous when an elevated temperature-curing polymeric is used to cast the insulator body because the capacitor is typically of fluid-filled construction, and would be damaged by the high molding temperatures and shrinkage forces associated with the molding of the insulator body with an elevated temperature-curing polymeric.

Thus, it is a primary object of the present invention to provide a compact, low cost voltage sensing device that is incorporated into an insulator body so that the device can be substituted for a conventional insulator and also provide voltage signals for measuring the voltage in a circuit or for powering low-burden auxiliary apparatus.

It is a further object of the present invention to provide a method of fabricating a high voltage sensing device such that the electrical components are not damaged as a result of elevated temperature curing and shrinking forces.

These and other objects, advantages and features shall hereinafter appear, and for the purposes of illustration, but not of limitation, an exemplary embodiment of the present invention is illustrated in the appended drawings.

DESCRIPTION OF THE DRAWINGS

FIG. 1 is an end elevational view of a preferred embodiment of the present invention.

FIG. 2 is a top view of the embodiment illustrated in FIG. 1.

FIG. 3 is a bottom view of the embodiment illustrated in FIG. 1.

FIG. 4 is a corss-sectional view of the preferred embodiment illustrated in FIG. 1 showing the internal electrical components in full side view.

FIG. 5 is a cross-sectional view taken substantially along line 5—5 in FIG. 4 showing the internal electrical components in full side view.

FIG. 6 is a cross-sectional view taken substantially along line 6—6 in FIG. 4 showing the capacitor in full side view.

FIG. 7 is a schematic diagram of the electrical components of the preferred embodiment of the present invention.

FIG. 8 is a graphic computer test analysis of the voltage distribution within and surrounding the preferred embodiment.

DESCRIPTION OF THE PREFERRED EMBODIMENT

With reference to FIGS. 1 and 4, sensing device 10 comprises molded resin insulator body 12 having insulator skirts 14 molded around the periphery thereof to increase the surface leakage distance of insulator body 12. Insulator body 12 may be molded from an organic polymeric material which cures to a rigid state and has electrical insulating properties. Device 10 is mounted between a high voltage conductor 16 and a grounded supporting member 18. However, device 10 could be mounted between the high voltage side on any circuit or component and ground.

Conductor 16 is mounted to upper terminal insert 20 by screws 22. Upper terminal insert 20 is partially imbedded in the molded resin insulator body 12 and partially extends from the upper surface thereof. Connected to terminal 20 by screw 24 is upper capacitor bus 26. Upper capacitor bus 26 is molded into insulator body 12.

Grounded supporting member 18 is mounted to lower terminal insert 28 by screw 30. Lower terminal insert 28 is molded into molded resin insulator 12, and a portion thereof extends from the lower surface of insulator body 12.

A step-down transformer 32 is mounted on lower insert terminal 28 by plate 34, screws 36, and nuts and bolts 38. Transformer 32 has been dipped into a semi-rigid curing compound (not-shown) to provide a skin of flexible material which acts as a mechanical buffer between rigid insulator body 12 and the metallic components of transformer 32. Transformer 32 is also molded into insulator body 12 so that it is completely encased within insulator body 12. Also partially molded into molded resin insulator body 12 is output terminal connector 40. Connector 40 has two female terminal contacts 41 (see FIG. 3) for receiving a two prong male jack (not shown).

With reference to FIG. 3, also partially imbedded in body 12 and extending from the surface thereof are first spark gap electrode 70 and second spark gap electrode 72. First and second spark gap electrodes 70 and 72 are positioned in a recessed portion 74 at the lower corner of insulator body 12 in the immediate proximity to one another.

When molded resin insulator body 12 is molded, it is molded so that upper and lower terminal inserts 20 and 38, transformer 32, spark gap electrodes 70 and 72, and output terminal connector 40 are imbedded in body 12 as shown in FIG. 4. However, at the time of initial molding, a hollow capacitor receiving cavity 42 is formed in body 12. Capacitor receiving cavity 42 is illustrated in FIG. 4 as being filled with resin 62. However, at the time of initial molding of body 12 this volume is hollow. After insulator body 12 is molded, a capacitor 50 is inserted into cavity 42 and mounted to upper capacitor bus 26 by bolt 52. The other side of capacitor 50 is then connected to lower capacitor bus 54 by bolt 56. Lower capacitor bus 54 is attached to capacitor bus insert 58 by bolts 60.

After capacitor 50 is mounted within cavity 42 as described, cavity 42 is filled with room temperature curing polymeric compound 62 so that capacitor 50 is totally sealed within insulator body 12.

With reference to FIG. 7, a schematic diagram of the electrical components of sensing device 10 are illustrated. Upper terminal insert 20 is schematically illustrated as connected to one side of capacitor 50 by a conductor representing upper capacitor bus 26. The other side of capacitor 50 is connected to the schematic representation of capacitor bus insert 58 by a conductor representing lower capacitor bus 54. Step-down transformer 32 comprises primary winding 76 and secondary winding 78. One side of primary winding 76 is connected to capacitor bus insert 58 by conductor 80, and the other side of primary winding 76 is connected to lower terminal insert 28 by conductor 82. As previously indicated, lower terminal insert 28 is connected to ground Connected to capacitor bus insert 58 is first spark gap electrode 70, and connected to lower terminal insert 28 is second spark gap electrode 72 so that first and second spark gap electrodes 70 and 72 are connected in parallel across primary winding 76. Secondary winding 78 of step-down transformer 32 is connected by conductors 84 and 86 to terminal contacts 41 of output terminal connector 40.

Operation of sensing device 10 can be explained as follows. The AC voltage on conductor 16 causes current to flow through capacitor 50 and the primary winding 76 of transformer 32 to ground. Capacitor 50 and primary winding 76 represent a relatively high impedance load thus limiting the magnitude of current flow. The alternating current flowing through primary winding 76 induces a corresponding current through secondary winding 78. The transformer ratio between the primary and secondary winding 76 and 78 is approximately in the range of 20 to 1. Thus, there is a substantial step down of voltage at the output terminal contacts 41 of output terminal connector 40 and a corresponding high current. If a burden resistor is connected across output terminal contacts 41, output voltage will be available across the resistor. This output voltage is directly proportional to and representative of the voltage on the conductor 16, and consequently, this voltage output can be calibrated to determine the voltage on conductor 16. Output terminal contacts 41 of connector 40 can either be connected to a measuring device to determine the voltage on conductor 16, or they can be connected to a low-burden auxiliary apparatus so that the output can be utilized to power such an auxiliary apparatus. In addition, the output may also be used to charge storage batteries to provide power for the operation of auxiliary apparatus in the absence of an independent control voltage source. Further, the output of the secondary winding 78 is capable of powering a much larger burden than that which may be placed on output tap of a conventional capacitor type divider of similar physical size. Moreover, the output may also be used to provide a voltage signal to control apparatus such as a preferred-emergency throw-over scheme to operate that control apparatus. However, if output terminal contacts 41 are short circuited, the sensing device will not be damaged in as much as capacitor 50 is designed to continuously withstand the full line to ground voltage.

To secure desirably physical characteristics and manufacturing economics, it is advantageous to use an elevated temperature-curing polymeric compound such as cycloaliphatic epoxy resin to mold insulator body 12. When such elevated temperature-curing polymeric is used, capacitor 12 could be damaged as a result of high temperatures and shrinkage forces. Consequently, the present invention also involves a method of fabricating sensing device 10 to prevent damage to capacitor 18 as a result of high molding temperatures and shrinkage forces associated with the casting of insulator body 12 if an elevated temperature-curing polymeric is used. In particular, upper terminal insert 20 is connected to upper capacitor bus 26 and positioned within a mold conforming to the exterior surface of insulator body 12. Next, transformer 32 and lower terminal insert 28 are mounted together as previously described and the various electrical connections between the primary winding 76 and lower terminal insert 28, capacitor bus insert 58, and first and second spark gap electrodes 70 and 72 are made. The secondary winding 78 is also connected to output terminal connector 40. These components are then positioned within the mold so that they will assume the positions illustrated in FIGS. 1, 3, and 4. The mold also is formed to create the hollow capacitor receiving cavity 42. The mold is then filled with an elevated temperature-curing polymeric compound which enclosed and surrounds the various electrical components as illustrated in FIG. 4. After the insulator body 12 has been molded, cured, and removed from the mold, the capacitor 50 is then inserted into cavity 42 and connected to upper and lower capacitor buses 26 and 54. Lower capacitor bus 54 is then connected to capacitor bus insert 58. Capacitor receiving cavity 42 is then filled with a lower temperature-curing polymeric compound 62 so that capacitor 50 is completely surrounded with insulating polymeric and sealed within insulator body 12. The temperature of curing of the lower temperature-curing polymeric compound must be low enough to avoid temperature and shrinkage force damage to capacitor 50. A variety of polymeric and epoxy compounds or resins which will cure at low enough temperatures so as to avoid damage to capacitor 50 may be used.

This method of fabricating sensing device 10 is particularly advantageous since capacitor 50 is typically of fluid-filled construction, and capacitor 50 would be damaged by the high molding temperatures and shrinkage forces associated with the casting of insulator body 12. However, the lower temperature-curing polymeric 62 does not damage capacitor 50 since it cures at lower temperatures and does not experience the shrinkage forces associated with the high temperature casting of insulator body 12. Moreover, in service, the lower temperature-curing polymeric 62 continues to serve as a buffer or cushion to protect the capacitor 50 from differential dimensional changes resulting from ambient temperatures and the changing temperatures associated with operation of sensing device 10.

Another advantage of the present invention is that upper terminal insert 20 and lower terminal insert 28 can be adapted to conform to the same mounting configuration as a conventional support insulator. Thus, sensing device 10 can be utilized to replace a conventional support insulator in a circuit so that dual functions, i.e., voltage sensing and support insulation are performed at one location.

Spark gap electrodes 70 and 72 are provided to limit the voltage which may occur across transformer primary winding 76 in the event of an open secondary winding circuit or an open primary winding. Thus, if the voltage across primary winding 76 becomes excessive, an arc will form between first and second spark gap electrodes 70 and 72. The distance between spark gap electrodes can be varied to adjust the voltage at which an arc will form.

Another advantage of the present invention involves the arrangements of the various electrical components into a minimum volume while maintaining a uniform voltage distribution. Substantially uniform voltage gradients are obtained in the insulator body 12 between the various electrical components as arranged as shown in FIG. 4 during operation of sensing device 10. The voltage across the capacitor 50 divides uniformly along its length and this voltage distribution contributes to a favorable voltage distribution between the transformer 32 and the capacitor 50. Thus, the performance of insulator body 12 as an insulator is not compromised by the presence of internal electrical components.

The present invention also provides a dual function of both mechanical support and line to ground insulation for the conductor 16 or any other component that may be mounted to upper terminal insert 20, while providing the voltage sensing capabilities. Thus, the present invention provides a unique voltage sensing circuit that is encapsulated within an insulator body such that the insulator body may be substituted for a conventional support insulator and thereby provide the additional voltage sensing function at the same location.

With reference to FIG. 8, a graphic computer test analysis of the actual voltage distribution within and surrounding the sensing device 10 is illustrated. FIG. 8 illustrates that the actual voltage distribution within sensing device 10 is relatively uniform between the various metallic and electrical components within the insulator body 12. One hundred percent (100%) of the voltage is applied to upper terminal 20 and zero voltage is applied on the grounded lower terminal 28 and the body of transformer 32. Each equipotential line represents a ten percent (10%) voltage increment. As is apparent, there is no crowding of equipotential lines which would identify voltage gradients sufficient to cause failure of the insulator body 12. Thus, it can be seen that the side-by-side positioning of the capacitor 50 and the transformer 32 permits fabrication of a sensing device 10 with a minimum volume and length without producing an unfavorable voltage distribution.

It should be expressly understood that various modifications, variations, and changes in the structure of the embodiment illustrated herein may be made without departing from the spirit and scope of the present invention as defined in the appended claims.

I claim:
1. A voltage sensing device for providing a signal representative of the voltage between the high voltate side of a circuit and ground comprising:
a capacitor electrically connected at a first side to the high voltage side of the circuit;
a transformer having primary and secondary windings, said primary winding being serially connected between the second side of said capacitor and ground so that all of the current flowing through said capacitor also flows through said primary winding;
output terminals connected across said secondary winding;
an insulator body means formed of an electrically insulating material surrounding said capacitor and said transformer for providing line to ground insulation between the high voltage side of the circuit and ground;

whereby the signal representative of the voltage on the high voltage side of the circuit can be derived at said output terminals as well as electrical power for low-burden auxiliary apparatus.

2. A voltage sensing device, as claimed in claim 1, further comprising voltage limiting means electrically connected in parallel across said primary winding for limiting the voltage across said primary winding.

3. A voltage sensing device, as claimed in claim 1, wherein said insulator body means is formed of an organic polymeric compound.

4. A voltage sensing device, as claimed in claim 3, wherein said organic polymeric compound is a cast cycloaliphatic epoxy resin.

5. A voltage sensing device, as claimed in claim 1, wherein said insulator body means has surface elongating means formed around the periphery thereof to elongate the path between the high voltage side of the circuit and ground.

6. A voltage sensing device, as claimed in claim 1, wherein the ratio of said primary winding to said secondary winding is approximately 20 to 1.

7. A voltage sensing device, as claimed in claim 1, wherein said insulator body means is dimensioned and adapted to be physically interchangeable with a conventional support insulator.

8. A voltage sensing device, as claimed in claim 1, wherein said capacitor and said transformer are positioned side by side within said insulator body means so that said insulator body means can be dimensioned to a minimum volume while maintaining a substantially uniform voltage distribution within the insulating material of said insulator body means.

9. A voltage sensing device, as claimed in claim 1, wherein said transformer is coated with a semi-rigid curing compound to provide a mechanical buffer between said insulator body means and said transformer.

10. A voltage sensing device for providing a voltage signal representative of the voltage between the high voltage side of a circuit and ground comprising:
a first support terminal adapted to be connected to the high voltage side of the circuit;
a second support terminal adapted to be connected to ground;
a transformer mounted on said second support terminal, said transformer having primary and secondary windings, one side of said primary winding being connected to the second support terminal;
a capacitor electrically connected between said first support terminal and the other side of said primary winding;
voltage limiting means electrically connected in parallel across said primary winding;
first and second output terminals connected in parallel across said secondary winding;
an insulator body made of an electrically insulating material, said capacitor and said transformer being encased within said insulator body and said first and second support terminals being partially encased within said insulator body but partially extending from opposite surfaces of said insulator body, and said first and second output terminals being partially encased within said insulator body but partially extending from the surface of said insulator body,
whereby the voltage signal representative of the voltage on the high voltage side of the circuit can be derived at said output terminals.

11. A voltage sensing device, as claimed in claim 10, wherein said insulator body is formed of an organic polymeric compound.

12. A voltage sensing device, as claimed in claim 10, wherein said insulator body has insulator skirts formed around the periphery thereof.

13. A voltage sensing device, as claimed in claim 10, wherein said insulator body is dimensioned and adapted to be physically interchangeable with a conventional support insulator.

14. A voltage sensing device, as claimed in claim 10, wherein said capacitor and said transformer are positioned side by side within said insulator body so that said insulator body can be dimensioned to a minimum volume while maintaining a substantially uniform voltage distribution within the insulating material of said insulator body.

15. A voltage sensing device for providing a voltage signal representative of the voltage between the high voltage side of a circuit and ground comprising:
an insulator body molded of a first elevated temperature-curing polymeric compound, said insulator body means having formed therein a capacitor receiving cavity;
a capacitor positioned within the capacitor receiving cavity, one side of said capacitor being connected to the high voltage side of said circuit;
a second lower temperature-curing polymeric compound surrounding said capacitor and filling the capacitor receiving cavity, the temperature of curing of said second polymeric compound being low enough to avoid temperature and shrinkage force damage to the capacitor;
a transformer having primary and secondary windings molded within said insulator body, said primary winding being serially connected from the other side of said capacitor to ground;
output terminals partially imbedded in said insulator body and extending from a surface thereof, said output terminals being connected across said secondary winding;
whereby the voltage signal representative of the voltage on the high voltage side of the circuit can be derived at said output terminals.

16. A voltage sensing device, as claimed in claim 15, further comprising first and second spark gap electrodes electrically connected across said primary winding, said first and second spark gap electrodes being molded into said insulator body and partially extending from a surface of said insulator body in immediate proximity to one another so that an arc will form between said first and second spark gap electrodes to limit the voltage across said primary winding when the voltage across said primary winding exceeds a predetermined level.

17. A voltage sensing device, as claimed in claim 15, wherein said first elevated temperature-curing polymeric compound is a cast cycloaliphatic epoxy resin.

18. A method of fabricating a voltage sensing device having electrical components including a capacitor comprising the steps of:
molding an insulator body from a first elevated temperature-curing polymeric compound so that a hollow capacitor receiving cavity is formed therein, and so that all electrical components except the capacitor are imbedded in the insulator body;
inserting the capacitor into the capacitor receiving cavity;

connecting the capacitor to the electrical components;

filling the capacitor receiving cavity with a second lower temperature-curing polymeric compound to completely enclose the capacitor in the insulator body, the temperature of curing of said second lower temperature-curing polymeric compound being lower enough to avoid temperature and shrinkage force damage to the capacitor;

whereby damage to the capacitor resulting from high temperatures and shrinkage forces associated with the first elevated temperature-curing polymeric compound is avoided.

19. A method of fabricating a voltage sensing device comprising: the steps of:

connecting a first capacitor bus to a first support terminal;

connecting one side of a primary winding of a step-down transformer to a second support terminal;

connecting one side of a secondary winding of the step-down transformer to a first output terminal;

connecting one side of a secondary winding of the step-down transformer to a second output terminal;

molding an insulator body from a first elevated temperature-curing epoxy resin so that a hollow capacitor receiving cavity is formed therein and so that the first support terminal is imbedded therein and partially extends beyond a first surface of the insulator body, so that the transformer is entirely encased in the insulator body, so that the second support terminal is imbedded therein and partially extends beyond a second surface of the insulator body, and so that the first and second output terminals partially extend from a surface of the insulator body;

inserting a capacitor into the capacitor receiving cavity;

connecting one side of the capacitor to the first capacitor bus;

connecting a second capacitor bus from the other side of the capacitor to the other side of the primary winding;

filling the capacitor receiving cavity with a second lower temperature-curing epoxy resin to completely enclose the capacitor in the insulator body, the temperature of curing of said second lower temperature-curing epoxy resin being low enough to avoid temperature and shrinkage force damage to the capacitor, whereby damage to the capacitor resulting from high temperatures and shrinkage forces associated with the first high temperature-curing epoxy resin is avoided.

20. A method, as claimed in claim 19, further comprising the steps of:

connecting a first spark gap electrode to one side of the primary winding;

connecting a second spark gap electrode to the other side of the primary winding;

molding the resin insulator body so that the first and second spark gap electrodes extend from a surface of the insulator body in immediate proximity to one another whereby excessive voltage across said primary winding will cause arcing between the spark gap electrodes externally of the insulator body.

21. A voltage sensing device comprising:

sensing means for providing output signals representative of the voltage on a high voltage side of an electrical circuit including a capacitor serially connected between the electrical circuit and one side of a primary winding of a transformer, the other side of said primary winding being connected to ground so that all of the current flowing in said capacitor also flows in said primary winding, said transformer also having a secondary winding that provides signals representative of the voltage on the high voltage side of the electrical circuit as well as electrical power for low-burden auxiliary apparatus;

an insulator body means formed of an electrically insulating polymeric material surrounding said sensing means for providing mechanical support for said sensing means, and for providing insulation between the high voltage side of the circuit and ground.

22. A voltage sensing device for providing a signal representative of the voltage between a first and a second terminals comprising:

a capacitor electrically connected at a first side to the first terminal;

a transformer having primary and secondary windings, said primary winding being serially connected between the second side of said capacitor and the second terminal so that all of the current flowing through said capacitor flows through said primary winding;

output terminals connected across said secondary winding;

an insulator body means formed of electrically insulating material surrounding said capacitor and said transformer for providing insulation between the first and second terminals;

whereby the signal representative of the voltage between the first and second terminals can be derived at said output terminals as well as electrical power for low-burden auxiliary apparatus.

* * * * *